(12) United States Patent
Delmerico

(10) Patent No.: US 7,346,462 B2
(45) Date of Patent: Mar. 18, 2008

(54) SYSTEM, METHOD, AND ARTICLE OF MANUFACTURE FOR DETERMINING PARAMETER VALUES ASSOCIATED WITH AN ELECTRICAL GRID

(75) Inventor: Robert Delmerico, Clifton Park, NY (US)

(73) Assignee: General Electric Company, Niskayuna, NY (US)

( * ) Notice: Subject to any disclaimer, the term of this patent is extended or adjusted under 35 U.S.C. 154(b) by 31 days.

(21) Appl. No.: 11/392,107

(22) Filed: Mar. 29, 2006

(65) Prior Publication Data

US 2007/0233406 A1 Oct. 4, 2007

(51) Int. Cl.
  *G01R 21/00* (2006.01)
  *H02J 1/00* (2006.01)
  *H02M 7/00* (2006.01)
(52) U.S. Cl. .................. 702/60; 702/65; 290/40 B; 290/40 C; 307/30; 307/45; 318/762; 318/763; 318/767; 700/286; 700/292
(58) Field of Classification Search .................. 702/60; 318/762, 763; 361/60, 62; 700/286, 292
  See application file for complete search history.

(56) References Cited

U.S. PATENT DOCUMENTS

| | | | |
|---|---|---|---|
| 5,592,028 A | 1/1997 | Pritchard | 290/55 |
| 5,740,677 A | 4/1998 | Vestesen | 60/698 |
| 6,023,105 A | 2/2000 | Youssef | 290/54 |
| 6,605,880 B1 | 8/2003 | Jaunich | 307/80 |
| 6,670,721 B2 | 12/2003 | Lof | 290/44 |
| 6,841,893 B2 | 1/2005 | Maiwald | 290/43 |
| 7,016,793 B2 * | 3/2006 | Ye et al. | 702/60 |
| 2002/0110522 A1 | 8/2002 | Chin | 423/658.2 |
| 2003/0202889 A1 | 10/2003 | Myers | 417/334 |
| 2003/0227276 A1 | 12/2003 | Agbossu | 320/112 |

FOREIGN PATENT DOCUMENTS

| | | |
|---|---|---|
| EP | 0 535 382 B1 | 9/1992 |
| EP | 1 137 149 A2 | 3/2001 |
| EP | 1 387 462 A2 | 1/2003 |
| JP | 20000073931 | 3/2000 |
| JP | 2002317750 | 10/2002 |
| WO | WO 02/21661 A1 | 3/2002 |

OTHER PUBLICATIONS

Contemporaneously filed US patent application for System, Method, and Article of Manufacture for Controlling Operation of an Electrical Power Generation System filed Mar. 29, 2006.

* cited by examiner

*Primary Examiner*—Bryan Bui
*Assistant Examiner*—Sujoy Kundu
(74) *Attorney, Agent, or Firm*—Ann M. Agosti; Patrick K. Patnode

(57) ABSTRACT

A system, method, and article of manufacture for determining parameter values associated with an electrical grid in accordance with an exemplary embodiment is provided. The electrical grid has a point of interconnection where the electrical grid is electrically coupled to a power source. The method includes measuring real power at the point of interconnection of the electrical grid to obtain a plurality of real power values. The method further includes measuring reactive power at the point of interconnection of the electrical grid to obtain a plurality of reactive power values. The method further includes measuring a voltage at the point of interconnection of the electrical grid to obtain a plurality of voltage values. The method further includes estimating at least one parameter value associated with the electrical grid utilizing the plurality of real power values, the plurality of reactive power values, and the plurality of voltage values, and a mathematical estimation technique.

9 Claims, 9 Drawing Sheets

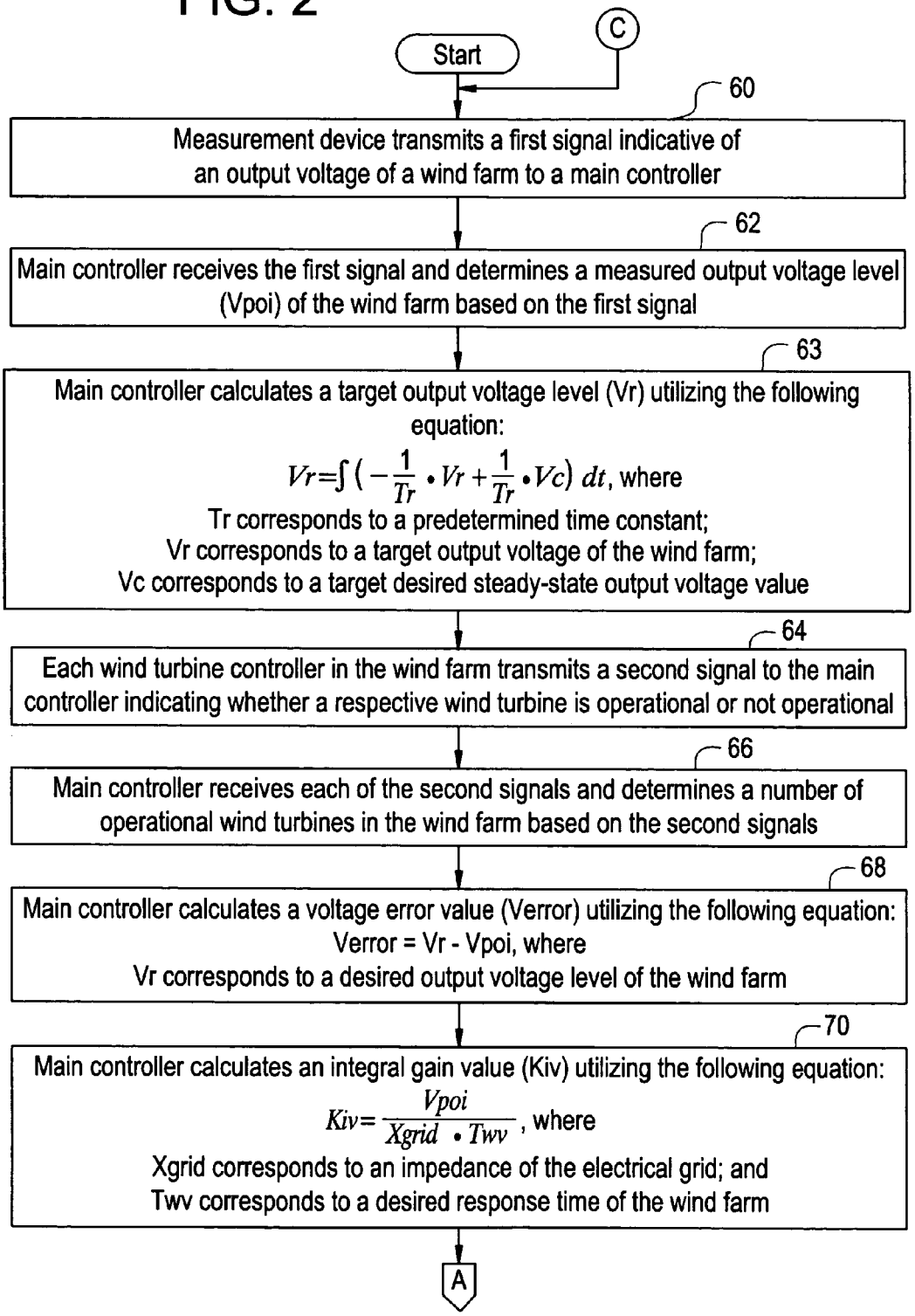

FIG. 3

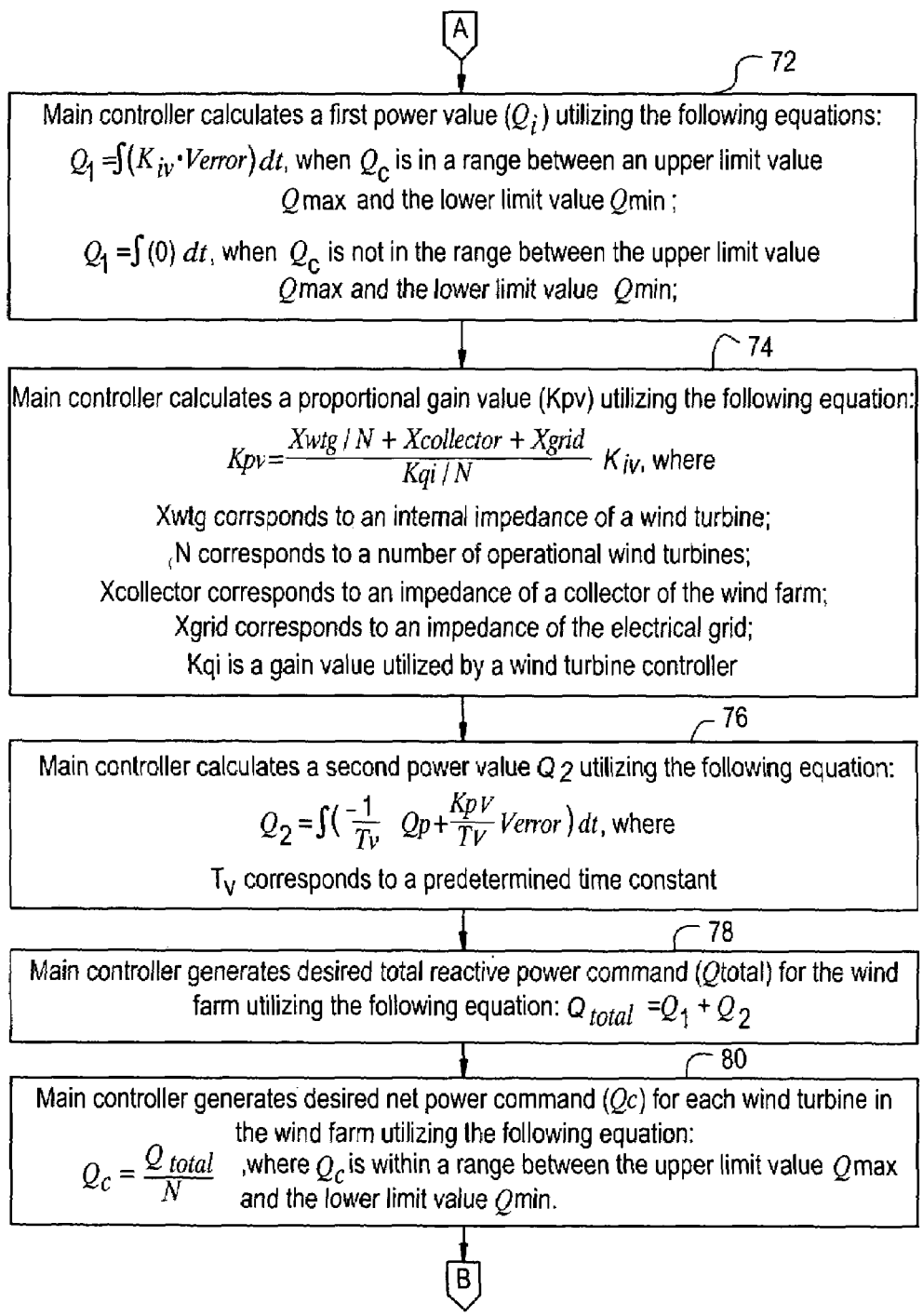

(A)

⟶ 72

Main controller calculates a first power value ($Q_1$) utilizing the following equations:

$Q_1 = \int (K_{iv} \cdot Verror)\,dt$, when $Q_c$ is in a range between an upper limit value $Q$max and the lower limit value $Q$min;

$Q_1 = \int (0)\,dt$, when $Q_c$ is not in the range between the upper limit value $Q$max and the lower limit value $Q$min;

⟶ 74

Main controller calculates a proportional gain value (Kpv) utilizing the following equation:

$$Kpv = \frac{Xwtg/N + Xcollector + Xgrid}{Kqi/N} K_{iv}, \text{ where}$$

Xwtg corrsponds to an internal impedance of a wind turbine;
N corresponds to a number of operational wind turbines;
Xcollector corresponds to an impedance of a collector of the wind farm;
Xgrid corresponds to an impedance of the electrical grid;
Kqi is a gain value utilized by a wind turbine controller

⟶ 76

Main controller calculates a second power value $Q_2$ utilizing the following equation:

$$Q_2 = \int \left(\frac{-1}{Tv} Qp + \frac{KpV}{TV} Verror\right) dt, \text{ where}$$

$T_V$ corresponds to a predetermined time constant

⟶ 78

Main controller generates desired total reactive power command (Qtotal) for the wind farm utilizing the following equation: $Q_{total} = Q_1 + Q_2$

⟶ 80

Main controller generates desired net power command ($Q_c$) for each wind turbine in the wind farm utilizing the following equation:

$$Q_c = \frac{Q_{total}}{N}, \text{ where } Q_c \text{ is within a range between the upper limit value } Q\text{max and the lower limit value } Q\text{min.}$$

(B)

SYSTEM, METHOD, AND ARTICLE OF MANUFACTURE FOR DETERMINING PARAMETER VALUES ASSOCIATED WITH AN ELECTRICAL GRID

BACKGROUND OF THE INVENTION

A wind farm utilizes a plurality of wind turbines to generate electrical power. The wind farm is generally electrically coupled at a point of interconnection to an electrical grid.

A control system is utilized to control the electrical output from a wind farm to meet utility requirements at the point of interconnection with an electrical grid of a utility company. However, a well-known problem associated with the conventional control system is that the control system is unable to determine electrical grid parameter values that cannot be directly measured such as a grid resistance value, a grid reactance value, and a grid voltage value assuming an infinite bus size.

The inventors herein have recognized a need for an improved control system and method for that can determine parameter values associated with an electrical grid.

BRIEF DESCRIPTION OF THE INVENTION

A method for determining parameter values associated with an electrical grid in accordance with an exemplary embodiment is provided. The electrical grid has a point of interconnection where the electrical grid is electrically coupled to a power source. The method includes measuring real power at the point of interconnection of the electrical grid to obtain a plurality of real power values. The method further includes measuring reactive power at the point of interconnection of the electrical grid to obtain a plurality of reactive power values. The method further includes measuring a voltage at the point of interconnection of the electrical grid to obtain a plurality of voltage values. The method further includes estimating at least one parameter value associated with the electrical grid utilizing the plurality of real power values, the plurality of reactive power values, and the plurality of voltage values, and a mathematical estimation technique.

A system for determining parameter values associated with an electrical grid in accordance with another exemplary embodiment is provided. The electrical grid has a point of interconnection where the electrical grid is electrically coupled to a power source. The system includes a measurement device configured to measure real power at the point of interconnection of the electrical grid to obtain a plurality of real power values. The measurement device is further configured to measure reactive power at the point of interconnection of the electrical grid to obtain a plurality of reactive power values. The measurement device is further configured to measure a voltage at the point of interconnection of the electrical grid to obtain a plurality of voltage values. The system further includes a controller operably communicating with the measurement device. The controller is configured to estimate at least one parameter value associated with the electrical grid utilizing the plurality of real power values, the plurality of reactive power values, and the plurality of voltage values, and a mathematical estimation technique.

An article of manufacture in accordance with another exemplary embodiment is provided. The article of manufacture includes a computer storage medium having a computer program encoded therein for determining parameters values associated with an electrical grid. The electrical grid has a point of interconnection where the electrical grid is electrically coupled to a power source. The computer storage medium includes code for measuring real power at the point of interconnection of the electrical grid to obtain a plurality of real power values. The computer storage medium further includes code for measuring reactive power at the point of interconnection of the electrical grid to obtain a plurality of reactive power values. The computer storage medium further includes code for measuring a voltage at the point of interconnection of the electrical grid to obtain a plurality of voltage values. The computer storage medium further includes code for estimating at least one parameter value associated with the electrical grid utilizing the plurality of real power values, the plurality of reactive power values, and the plurality of voltage values, and a mathematical estimation technique.

Other systems and/or methods according to the embodiments will become or are apparent to one with skill in the art upon review of the following drawings and detailed description. It is intended that all such additional systems and methods be within the scope of the present invention, and be protected by the accompanying claims.

BRIEF DESCRIPTION OF THE DRAWINGS

FIGS. 2-4 are flowcharts of a method for controlling the wind farm of FIG. 1 in accordance with another exemplary embodiment;

DETAILED DESCRIPTION OF THE INVENTION

Figure 1:
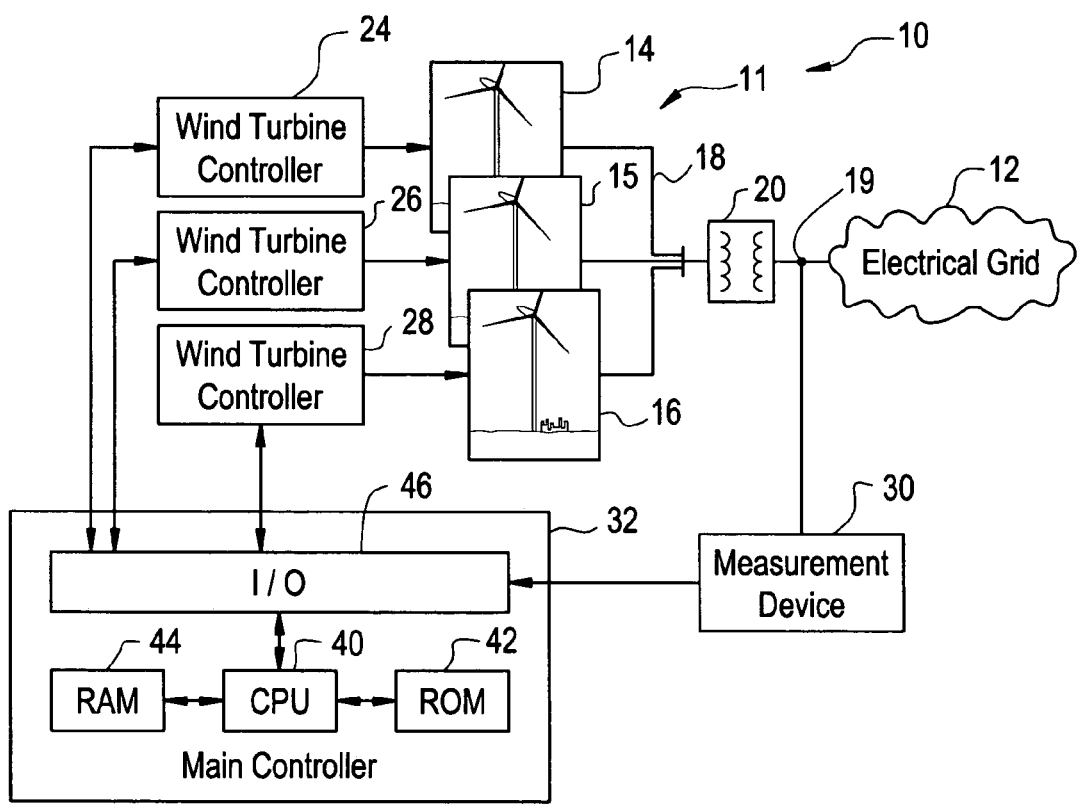
FIG. 1 is a block diagram of an electrical power generation system having a wind farm and an electrical grid in accordance with an exemplary embodiment.

Referring to FIG. 1, an electrical power generation system 10 for generating electrical power is illustrated. The electrical power generation system 10 includes a wind farm 11 electrically coupled to an electrical grid 12. The electrical grid 12 is utilized to transfer electrical power from the wind farm 11 to electrical loads. In alternative exemplary embodiments, the electrical power generation system 10 can include at least one of micro-turbines, solar cell arrays, and conventional electrical generators, to replace the wind farm 11.

The wind farm 11 is provided to generate electrical power utilizing wind energy. The wind farm 11 includes wind turbines 14, 15, 16, a collector system 18, a transformer 20, wind turbine controllers 24, 26, 28, a measurement device 30, and a main controller 32. It should be noted that a number of wind turbines utilized in the wind farm 11 can vary. For example, the number of wind turbines in the wind farm 11 can be greater than three wind turbines or less than or equal to three wind turbines.

The wind turbines 14, 15, 16 are provided to generate voltages and currents utilizing wind energy. The wind turbines 14, 15, 16 are operably controlled utilizing the wind turbine controllers 24, 26, 28, respectively, which communicate with the wind turbines 14, 15, 16, respectively.

The wind turbine controllers 24, 26, 28 are configured to generate command signals which control operation of the wind turbines 14, 15, 16, respectively. Further, the wind turbine controllers 24, 26, 28 are provided to measure operational parameters associated with the wind turbines 14, 15, 16 respectively. The wind turbine controllers 24, 26, 28 operably communicate with the main controller 32.

The collector system 18 is electrically coupled to the wind turbines 14, 15, 16 and routes voltages and currents from each of the turbines to the power transformer 20. The power transformer 20 receive the voltages and currents from the wind turbines 14, 15, 16 and outputs a voltage and a current having desired characteristics onto the electrical grid 12. For example, the power transformer 20 can output a voltage having a desired amplitude and a current having a desired amplitude onto the electrical grid 12.

The measurement device 30 is electrically coupled to a point of interconnection 19 between the transformer 20 and the electrical grid 12. The measurement device 30 is configured to measure electrical parameters associated with the electrical grid. For example, the measurement device 30 is configured to measure a voltage level (Vpoi) at the point of interconnection 19, a real power level (Pn) at the point of interconnection 19, and a reactive power level (Qn) at the point of interconnection 19. It should be noted that the measurement device 30 can measure parameters on either side of the transformer 20.

The main controller 32 is provided to control operation of the wind turbines 14, 15, 16 based on measured or estimated parameter values at the point of interconnection 19 associated with either the wind farm 11 or the electrical grid 12. The main controller 32 is configured to generate command messages that are received by the wind turbine controllers 24, 26, 28 for controlling operation of the wind turbines 14, 15, 16, respectively. The main controller 32 includes a central processing unit (CPU) 40, a read-only memory (ROM) 42, a volatile memory such as a random access memory (RAM) 44 and an input/output (I/O) interface 46. The CPU 40 operably communicates with the ROM 42, the RAM 44, and the I/O interface 46. The computer readable media including ROM 42 and RAM 44 may be implemented using any of a number of known memory devices such as PROMs, EPROMs, EEPROMS, flash memory or any other electric, magnetic, optical or combination memory device capable of storing data, some of which represent executable instructions used by the CPU 40. Further, the I/O interface 46 operably communicates with the wind turbine controllers 24, 26, 28.

Figure 4:
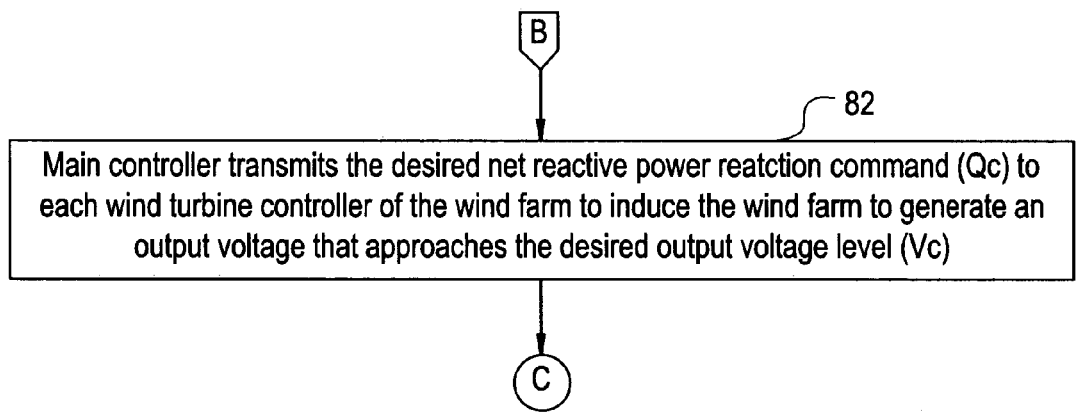

Referring to FIGS. 2-4, a method for controlling the operation of the wind farm 11 will now be explained. The method can be implemented utilizing software algorithms stored in a computer storage medium and executed by the main controller 32 and the wind turbine controllers 24, 26, and 28. It should be noted that in alternative exemplary embodiments, the foregoing method could also be implemented to control one or more micro-turbines, solar cell arrays, and fossil-fuel electrical generators, instead of the wind farm 11.

At step 60, the measurement device 30 transmits a first signal indicative of an output voltage of the wind farm 11 to the main controller 32.

At step 62, the main controller 32 receives the first signal and determines a measured output voltage level (Vpoi) of the wind farm 11 based on the first signal.

At step 63, the main controller 32 calculates a target output voltage level (Vr) utilizing the following equation:

$$V_r = \int \left( -\frac{1}{T_r} \cdot V_r + \frac{1}{T_r} V_C \right) dt,$$

where (Tr) corresponds to a predetermined time constant set by an operator;

(Vr) corresponds to a target output voltage of the wind farm 11; and (Vc) corresponds to the desired steady-state output voltage value of the wind farm 11.

It should be noted that in an alternate exemplary embodiment, instead of utilizing the foregoing equation to calculate (Vr), the following equation may be utilized to calculate (Vr): $V_r = V_C$.

At step 64, each wind turbine controller in the wind farm 11 transmits a second signal to the main controller 32 indicating whether a respective wind turbine is operational or not operational. For example, the wind turbine controllers 24, 26, 28 transmit second signals to the main controller 32 indicating whether wind turbines 14, 15, 16 respectively are operational or not operational. A wind turbine is operational when the wind turbine generates electrical power (e.g., real or reactive power) that is transmitted through the transformer 22 to the electrical grid 12.

At step 66, the main controller 32 receives each of the second signals and determines a number of operational wind turbines in the wind farm 11 based on the second signals.

At step 68, the main controller 32 calculates a voltage error value (Verror) utilizing the following equation: Verror=Vr−Vpoi, where (Vr) corresponds to a desired output voltage level of the wind farm 11.

At step 70, the main controller 32 calculates an integral gain value (Kiv) utilizing the following equation:

$$Kiv = \frac{Vpoi}{Xgrid \cdot Twv},$$

where (Xgrid) corresponds to a known or estimated impedance of the electrical grid 12; and (Twv) corresponds to a desired time response to the wind farm 11.

At step 72, the main controller 32 calculates a first power value ($Q_1$) utilizing the following equation: $Q_1 = \int (K_{iv} \cdot V_{error}) dt$, when a desired net power command ($Q_C$) is in a range between an upper limit value (Qmax) and a lower limit value (Qmin). Alternately, the main controller 32 calculates the first power ($Q_1$) utilizing the following equation: $Q_1 = \int (0) dt$ when ($Q_C$) is not in the range between the upper limit value (Qmax) and the lower limit value (Qmin).

At step 74, the main controller 32 calculates a proportional gain value (Kpv) utilizing the following equation:

$$Kpv = \frac{Xwtg/N + Xcollector + Xgrid}{Kqi/N} Kiv,$$

where (Xwtg) corresponds to an internal impedance of a wind turbine;

(N) corresponds to a number of operational wind turbines;

(Xcollector) corresponds to an impedance of the collector system 18 of the wind farm 11;

(Xgrid) corresponds to an impedance of the electrical grid 12;

(Kqi) is a gain value utilized by a wind turbine controller.

At step 76, the main controller 32 calculates a second power value ($Q_2$) utilizing the following equation:

$$Q_2 = \int \left(-\frac{1}{T_V}Q_2 + \frac{K_{pV}}{T_V}V_{error}\right)dt,$$

where ($T_V$) corresponds to a predetermined time constant that is typically smaller than the desired closed loop voltage response time interval.

At step 78, the main controller 32 generates a desired total reactive power command (Qtotal) for the wind farm utilizing the following equation:

$Q_{total} = Q_1 + Q_2.$

At step 80, the main controller 32 generates desired net power command (Qc) for each wind turbine 11 in the wind farm 11 utilizing the following equation:

$$Q_c = \frac{Q_{total}}{N}$$

when $Q_c$ is in a range between the upper limit value (Qmax) and the lower limit value (Qmin).

At step 82, the main controller 32 transmits the desired net reactive power command (Qc) to each wind turbine controller of the wind farm 11 to induce the wind farm 11 to generate an output voltage that approaches the desired output voltage level (Vc) at the point of interconnection 19. After step 82, the method returns to step 60.

Figure 5:
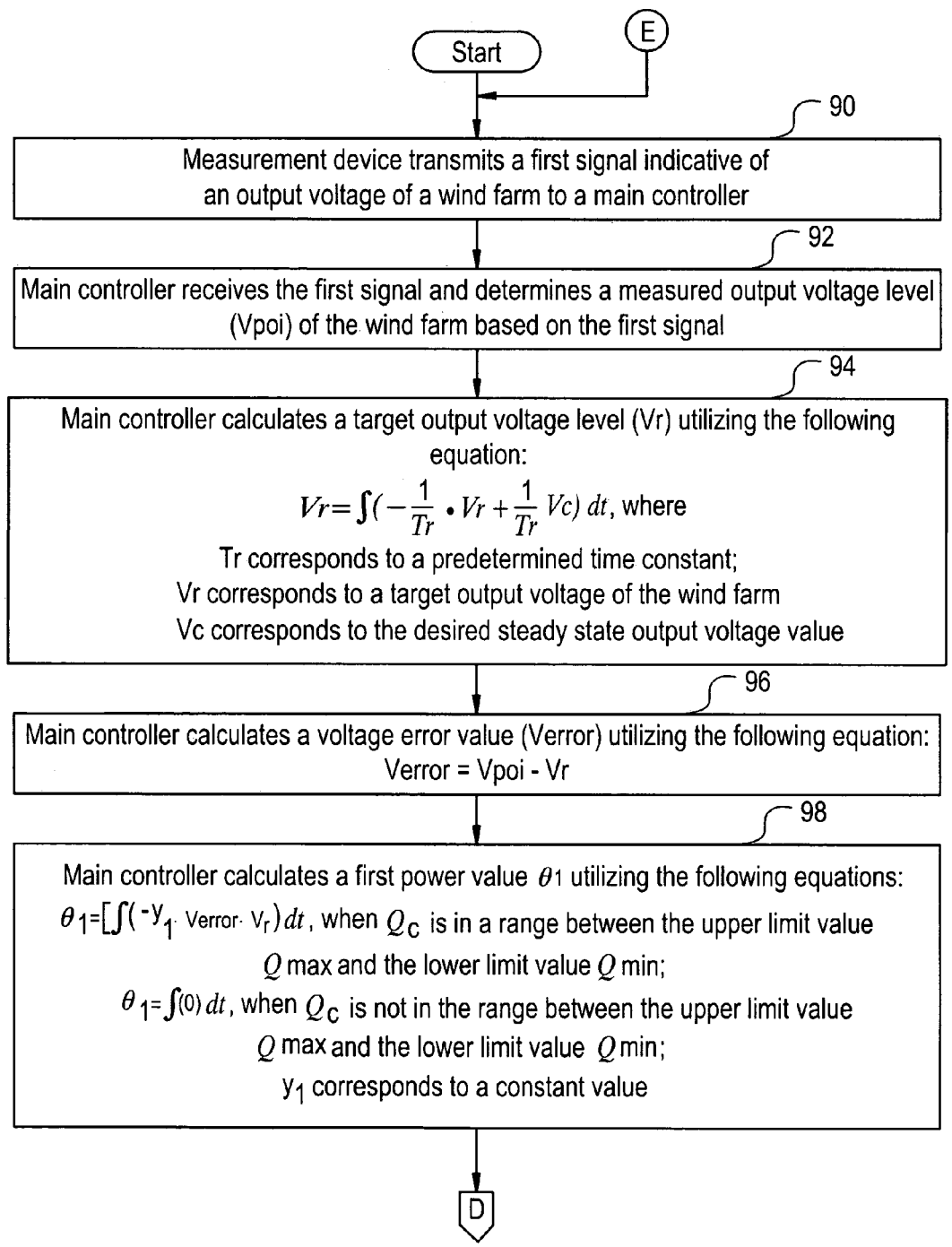
FIGS. 5-6 are flowcharts of a method for controlling the wind farm of FIG. 1 in accordance with another exemplary embodiment.
Figure 6:
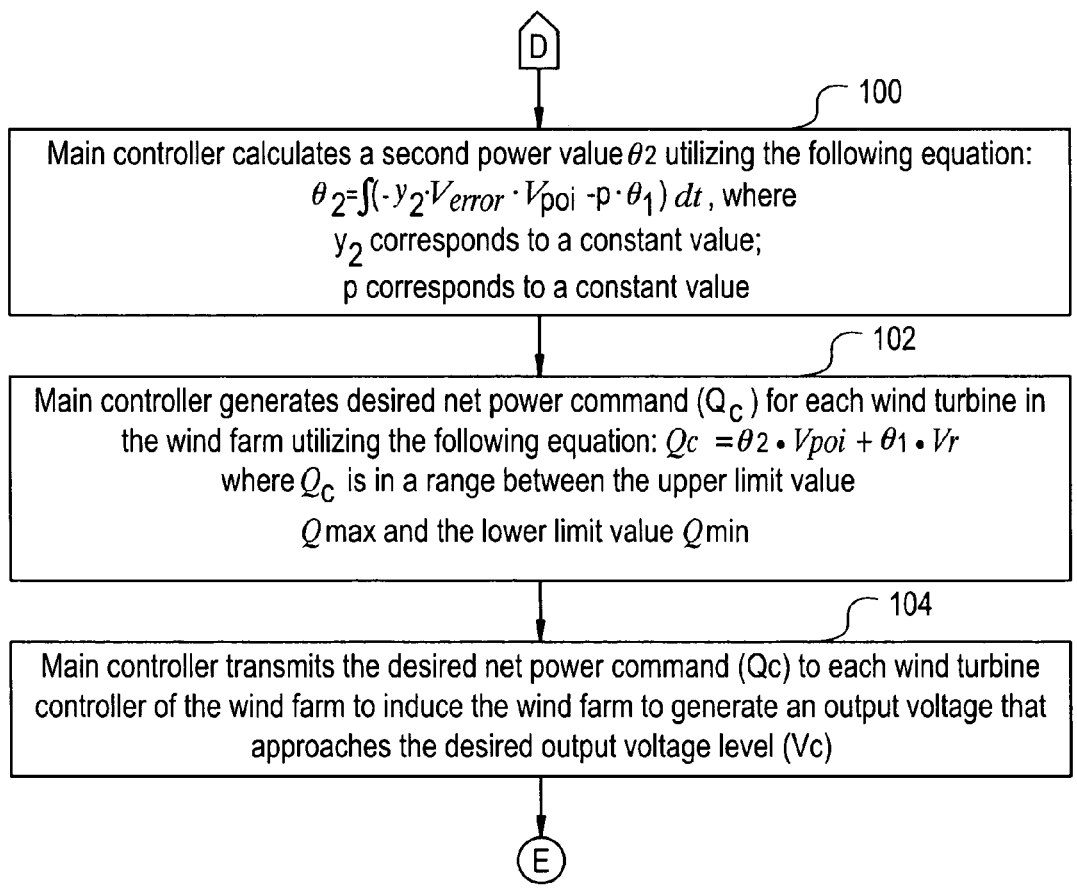
Figure 7:
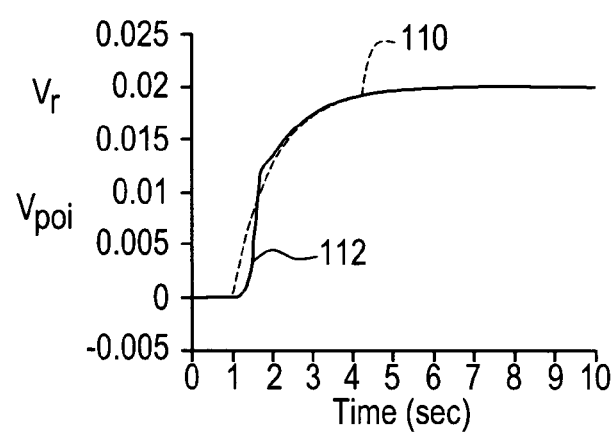
FIG. 7 is a schematic of an exemplary signal response of a measured output voltage level (Vpoi) and a desired output voltage level (Vr) of the wind farm.
Figure 8:
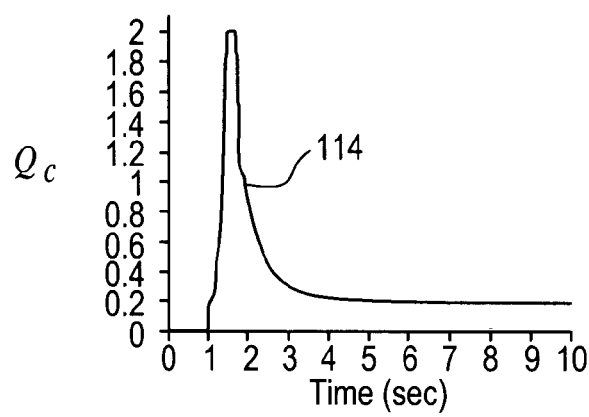
FIG. 8 is a schematic of an exemplary signal response of a desired net power command ($Q_C$) utilized to control the wind farm.
Figure 9:
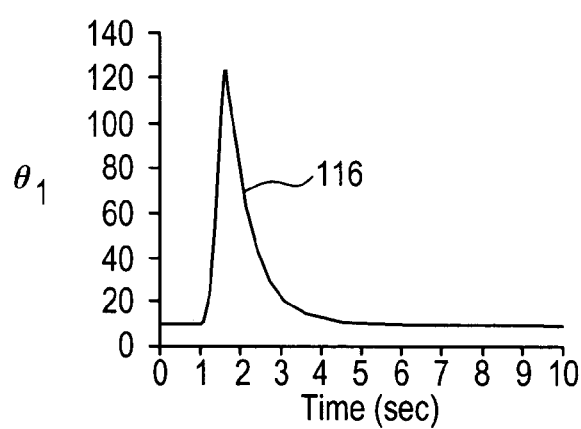
FIGS. 9 and 10 are schematics of exemplary signal responses corresponding to first and second power values ($\theta_1$), ($\theta_2$) utilized to control the wind farm.
Figure 10:
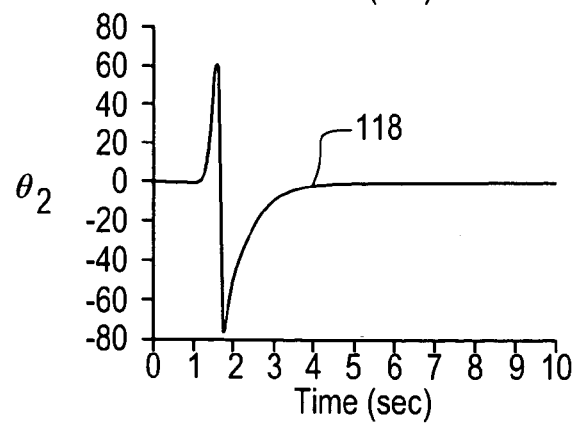

Referring to FIGS. 5-6, another method for controlling the operation of the wind farm 11 will now be explained. The method can be implemented utilizing software algorithms stored in a computer storage medium and executed by the main controller 32 and the wind turbine controllers 24, 26, and 28. It should be noted that in alternative exemplary embodiments, the following method could also be implemented to control one or more micro-turbines, solar cell arrays, and fossil-fuel electrical generators, instead of the wind farm 11.

At step 90, the measurement device 30 transmits a first signal indicative of an output voltage of a wind farm 11 to the main controller 32.

At step 92, the main controller 32 receives the first signal and determines a measured output voltage level (Vpoi) of the wind farm 11 based on the first signal.

At step 94, the main controller 32 calculates a target output voltage level (Vr) utilizing the following equation:

$$V_r = \int \left(-\frac{1}{T_r} \cdot V_r + \frac{1}{T_r}V_C\right)dt,$$

where (Tr) corresponds to a predetermined time constant set by an operator;

(Vr) corresponds to a target output voltage of the wind farm 11; and (Vc) corresponds to the desired steady-state output voltage value of the wind farm 11.

It should be noted that in an alternate exemplary embodiment, instead of utilizing the foregoing equation to calculate (Vr), the following equation may be utilized to calculate (Vr): $V_r = V_C$.

At step 96, the main controller 32 calculates a voltage error value (Verror) utilizing the following equation: Verror=Vpoi−Vr.

At step 98, the main controller 32 calculates a first power value $\theta_1$ utilizing the following equation: $\theta_1 = \int (-y_1 \cdot V_{error} \cdot V_r)dt$ when the desired net power command (Qc) is in the range between the upper limit value (Qmax) and the lower limit value (Qmin). Alternately, the main controller 32 calculates the first power ($Q_1$) utilizing the following equation: $Q_1 = \int (0)dt$, when ($Q_C$) is not in the range between the upper limit value (Qmax) and the lower limit value (Qmin), where ($y_1$) corresponds to a gain value set by the operator to obtain the desired closed loop response behavior; and (Vr) corresponds to a target output voltage level of the wind farm 11.

At step 98, the main controller 32 calculates a second power value $\theta_2$ utilizing the following equation: $\theta_2 = \int (-y_2 \cdot V_{error} \cdot V_{poi} - \rho \cdot \theta_2)dt$, where ($y_2$) corresponds to a gain value set by the operator to obtain the desired closed loop response behavior; and $\rho$ corresponds to a constant value set by the operator to obtain the desired closed loop response behavior.

At step 102, the main controller 32 generates the desired net reactive power command (Qc) for each wind turbine in the wind farm 11 utilizing the following equation: $Q_C = \theta_2 \cdot V_{poi} + \theta_1 \cdot V_r$, where ($Q_C$) is in the range between the upper limit value (Qmax) and the lower limit value (Qmin).

At step 104, the main controller 32 transmits the desired net power command (Qc) to each wind turbine controller of the wind farm 11 to induce the wind farm 11 to generate an output voltage that approaches the desired output voltage level (Vc). After step 104, the method returns to step 90.

Referring to FIGS. 7-10, the exemplary signal responses 116, 118 correspond to a first power value $\theta_1$ and a second power value $\theta_2$ as a function of time. The first power value $\theta_1$ and second power value $\theta_2$ are utilized to calculate a desired net power command (Qc). The exemplary signal response 114 corresponds to the net power command (Qc) to induce the measured output voltage level (Vpoi) at the point of interconnection 19 to approximate the target output voltage level (Vr). As shown, the exemplary signal response 112 corresponds to the output voltage level (Vpoi) that closely approximate the exemplary signal response 110.

A brief explanation of the mathematical equations for estimating parameter values associated with the electrical grid 12 will now be explained. A plurality of measurements at the point of interconnection 19 are utilized to estimate parameter values associated with the electrical grid 12. For example, a set of "n" data measurement values of a real power level (Pn), a reactive power level (Qn), and an grid voltage level (Vn) also referred to as (Vpoi) obtained at the point of interconnection 19, is used to determine parameter values for the simplified model of the electrical grid 12. The simplified model of the electrical grid 12 is defined by a phasor voltage ($V_g \cdot e^{j\theta}$) indicative of a positive sequence voltage of an infinite bus in the electrical grid 19 and an impedance ($Z_g = r + jx$) where "r" corresponds to a resistance value associated with the electrical grid 19 and "x" corresponds to a reactance value associated with the electrical grid 19. The relationship between these two terms can be stated mathematically utilizing the following equation:

$$P_n + jQ_n = \frac{V_n^2 - V_n \cdot V_g e^{-j\theta}}{r - jx}$$

By separating the real and complex terms of the foregoing equation and then eliminating θ, the following equation is obtained:

$$V_n^4 - 2 \cdot r \cdot P_n \cdot V_n^2 - 2 \cdot x \cdot Q_n \cdot V_n^2 + (r^2 + x^2) \cdot (P_n^2 + Q_n^2) - V_n^2 \cdot V_g^2 = 0$$

The foregoing equation is represented in matrix form as:

$$V_n^4 = [2 \cdot P_n \cdot V_n^2 - r \cdot (P_n^2 + Q_n^2)2 \cdot Q_n \cdot V_n^2 - x \cdot (P_n^2 + Q_n^2)V_n^2] \begin{bmatrix} r \\ x \\ V_g^2 \end{bmatrix}$$

Next, the three matrices Yn, Hn, and U are defined as shown below:

$$Y_n = V_n^4$$

$$H_n = \begin{bmatrix} 2 \cdot P_n \cdot V_n^2 - r \cdot (P_n^2 + Q_n^2)2 \cdot \\ Q_n \cdot V_n^2 - x \cdot (P_n^2 + Q_n^2)V_n^2 \end{bmatrix}$$

$$U = \begin{bmatrix} r \\ x \\ V_g^2 \end{bmatrix}$$

Next, a least squares estimation technique known to those skilled in the art is utilized to determine the unknown parameter values (r, x, and $V_g$). For example, a batch mode equation can be utilized to determine the unknown parameter values (r, x, and Vg), as shown below:

$$U_k = \left[ \sum_{n=1}^{k} H_n^T \cdot H_n \right]^{-1} \sum_{n=1}^{k} H_n^T \cdot Y_n$$

It should be noted that since r and x also appear in the $H_n$ term, an iterative solution is required. In general, a small random disturbance signal injection is required for convergence of the solution for the parameter values (r, x, and Vg). It should be further noted that other mathematical techniques such as recursive estimation techniques and Kalman filtering to achieve an optimal tracking of parameters in the presence of noise can be utilized.

Figure 12:
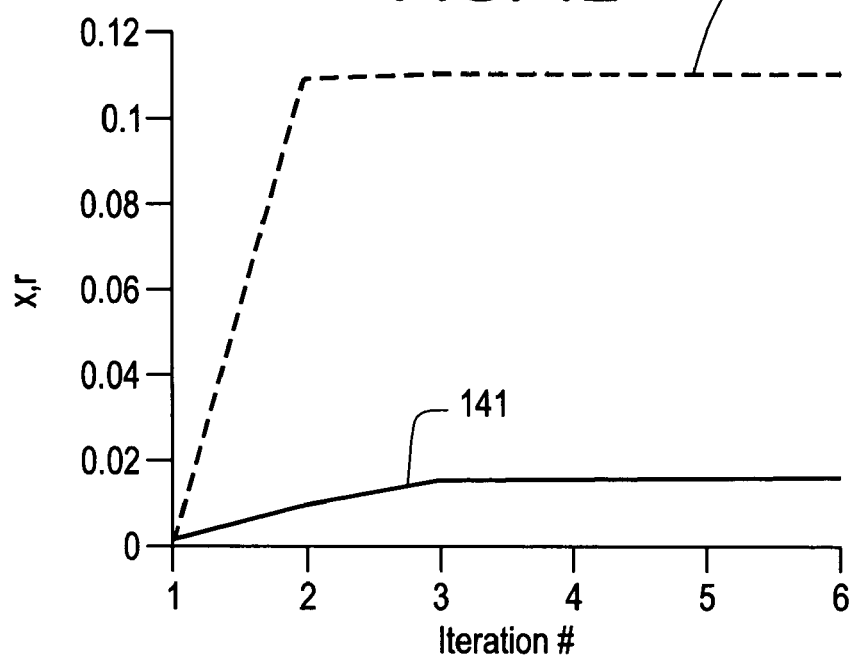
FIG. 12 is a schematic illustrating estimated grid reactance values and grid resistance values.
Figure 13:
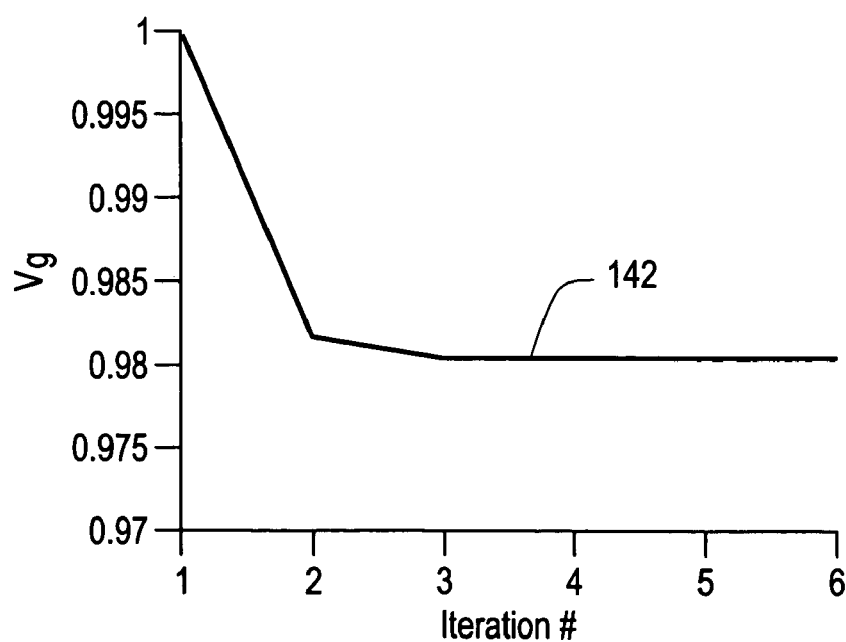
FIG. 13 is a schematic illustrating estimated grid voltage values.

Referring to FIGS. 12 and 13, a plot 40 illustrates convergence of the reactance value (x) associated with the electrical grid 12, by iteratively calculating ($U_k$). Further, a plot 141 illustrates convergence of the resistance (r) of the electrical grid 12, by iteratively calculating ($U_k$). Finally, the plot 142 illustrates convergence of the voltage level (Vg), by iteratively calculating ($U_k$).

Figure 11:
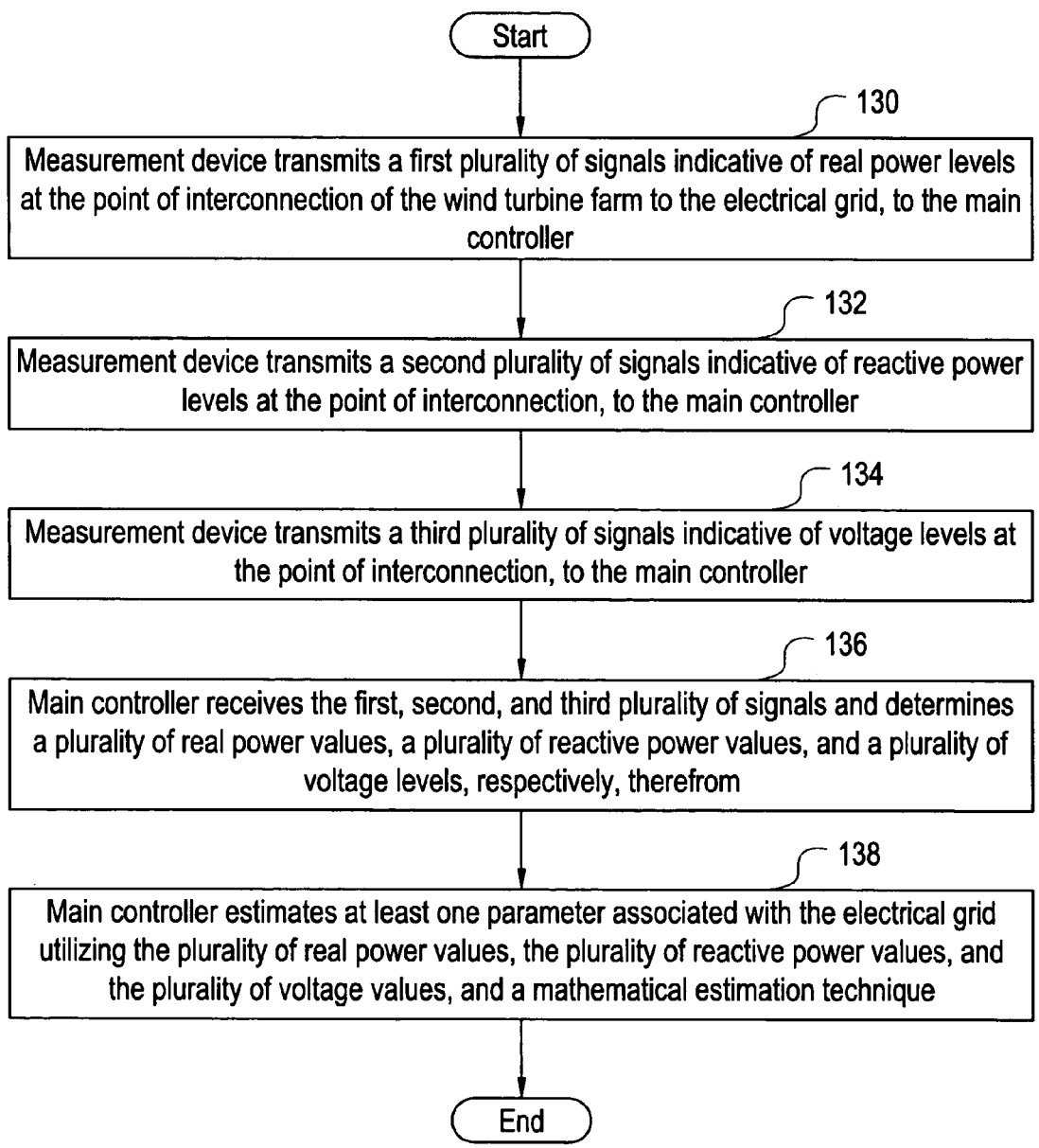
FIG. 11 is a flowchart of a method for determining parameters associated with an electrical grid.

Referring to FIG. 11, a method for determining parameter values associated with the electrical grid 12 utilizing the main controller 32 and the measurement device 30 will be explained. The method can be implemented utilizing software algorithms stored in a computer storage medium executed by the main controller 32.

At step 130, the measurement device 30 transmits a first plurality of signals indicative of real power levels (Pn) at the point of interconnection 19 of the wind farm 11 to the electrical grid 12, to the main controller 32.

At step 132, the measurement device 30 transmits a second plurality of signals indicative of reactive power levels (Qn) at the point of interconnection 19, to the main controller 32.

At step 134, the measurement device 30 transmits a third plurality of signals indicative of voltage levels (Vn) at the point of interconnection 19, to the main controller 32.

At step 136, the main controller 32 receives the first, second, and third plurality of signals and determines a plurality of real power values (Pn), a plurality of reactive power values (Qn), and a plurality of voltage levels (Vn), respectively, therefrom.

At step 138, the main controller 32 estimates at least one parameter associated with the electrical grid 12 utilizing the plurality of real power values (Pn), the plurality of reactive power values (Qn), and the plurality of voltage values (Vn), and a mathematical estimation technique. For example, the parameter values (r, x, and Vg) can be determined utilizing the plurality of real power values (Pn), the plurality of reactive power values (Qn), and the plurality of voltage values (Vn) and the mathematical equations described above.

The inventive system, method, and article of manufacture for controlling operation of a wind farm provide a substantial advantage over other system and methods. In particular, system, method, and article of manufacture provide a technical effect of estimating parameter values associated with an electrical grid utilizing measured values at a point of interconnection between a wind farm and an electrical grid.

The above-described methods can be embodied in the form of computer program code containing instructions embodied in tangible media, such as floppy diskettes, CD ROMs, hard drives, or any other computer-readable storage medium, wherein, when the computer program code is loaded into and executed by a computer, the computer becomes an apparatus for practicing the invention.

While the invention is described with reference to an exemplary embodiment, it will be understood by those skilled in the art that various changes may be made and equivalence may be substituted for elements thereof without departing from the scope of the invention. In addition, many modifications may be made to the teachings of the invention to adapt to a particular situation without departing from the scope thereof. Therefore, it is intended that the invention not be limited to the embodiment disclosed for carrying out this invention, but that the invention includes all embodiments falling with the scope of the intended claims. Moreover, the use of the term's first, second, etc. does not denote any order of importance, but rather the term's first, second, etc. are used to distinguish one element from another.

What is claimed is:

1. A method for determining parameter values associated with an electrical grid, the electrical grid having a point of interconnection where the electrical grid is electrically coupled to a power source, the method comprising:
   measuring real power at the point of interconnection of the electrical grid to obtain a plurality of real power values;
   measuring reactive power at the point of interconnection of the electrical grid to obtain a plurality of reactive power values;
   measuring a voltage at the point of interconnection of the electrical grid to obtain a plurality of voltage values;
   estimating at least one parameter value associated with the electrical grid utilizing the plurality of real power values, the plurality of reactive power values, and the plurality of voltage values, and a mathematical estimation technique; and
   controlling operation of a wind turbine to generate electrical power to the electrical grid based on the at least one estimated parameter value.

2. The method of claim 1, wherein the at least one estimated parameter value associated with the electrical grid comprises at least one of an electrical line resistance value, an electrical line reactance value, and a grid voltage value.

3. The method of claim 1, wherein the mathematical estimation technique comprises a least-squares estimation technique.

4. A system for determining parameter values associated with an electrical grid, the electrical grid having a point of interconnection where the electrical grid is electrically coupled to a power source, the system comprising:
   a measurement device configured to measure real power at the point of interconnection of the electrical grid to obtain a plurality of real power values, the measurement device further configured to measure reactive power at the point of interconnection of the electrical grid to obtain a plurality of reactive power values, the measurement device further configured to measure a voltage at the point of interconnection of the electrical grid to obtain a plurality of voltage values; and
   a controller operably communicating with the measurement device, the controller configured to estimate at least one parameter value associated with the electrical grid utilizing the plurality of real power values, the plurality of reactive power values, and the plurality of voltage values, and a mathematical estimation technique.

5. The system of claim 4, wherein the at least one estimated parameter value associated with the electrical grid comprises at least one of an electrical line resistance value, an electrical line reactance value, and a grid voltage value.

6. The system of claim 4, wherein the mathematical estimation technique comprises a least-squares estimation technique.

7. An article of manufacture, comprising:
   a computer storage medium having a computer program encoded therein for determining parameters values associated with an electrical grid, the electrical grid having a point of interconnection where the electrical grid is electrically coupled to a power source, the computer storage medium comprising:
   code for measuring real power at the point of interconnection of the electrical grid to obtain a plurality of real power values;
   code for measuring reactive power at the point of interconnection of the electrical grid to obtain a plurality of reactive power values;
   code for measuring a voltage at the point of interconnection of the electrical grid to obtain a plurality of voltage values; and
   code for estimating at least one parameter value associated with the electrical grid utilizing the plurality of real power values, the plurality of reactive power values, and the plurality of voltage values, and a mathematical estimation technique.

8. The article of manufacture of claim 7, wherein the at least one estimated parameter value associated with the electrical grid comprises at least one of an electrical line resistance value, an electrical line reactance value, and a grid voltage value.

9. The article of manufacture of claim 7, wherein the mathematical estimation technique comprises a least-squares estimation technique.

* * * * *